(12) United States Patent
Damitio et al.

(10) Patent No.: US 6,504,419 B1
(45) Date of Patent: Jan. 7, 2003

(54) HIGH-SPEED CLOSED LOOP SWITCH AND METHOD FOR VIDEO AND COMMUNICATIONS SIGNALS

(75) Inventors: Paul G. Damitio, Tucson, AZ (US); Joel M. Halbert, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 09/819,246

(22) Filed: Mar. 28, 2001

(51) Int. Cl.[7] .............................................. H03K 17/62
(52) U.S. Cl. ....................................... 327/413; 327/112
(58) Field of Search ................................. 327/407, 408, 327/409, 410, 411, 412, 413, 112; 330/51, 84; 370/535, 537, 541, 536

(56) References Cited

U.S. PATENT DOCUMENTS

| | | | |
|---|---|---|---|
| 3,638,131 A | 1/1972 | Sarkissian | 330/252 |
| 3,783,307 A | 1/1974 | Breuer | 327/411 |
| 4,191,856 A * | 3/1980 | Nagano et al. | 327/411 |
| 4,349,750 A | 9/1982 | Geurts | 327/411 |
| 4,367,419 A | 1/1983 | Yazawa et al. | 327/471 |
| 4,572,967 A | 2/1986 | Metz | 327/411 |
| 4,639,685 A | 1/1987 | Saller et al. | 330/263 |
| H310 H | 7/1987 | Johnson | 370/537 |
| 4,780,689 A | 10/1988 | Saller et al. | 330/267 |
| 4,893,091 A | 1/1990 | Lillis et al. | 330/253 |
| 5,003,269 A | 3/1991 | Lehmann | 330/267 |
| 5,045,804 A * | 9/1991 | Sugawara et al. | 327/411 |
| 5,148,121 A | 9/1992 | Uchida | 330/295 |
| 5,177,451 A | 1/1993 | Lehmann | 330/267 |
| 5,196,733 A | 3/1993 | Shin | 327/379 |
| 5,304,853 A * | 4/1994 | Choi | 327/411 |
| 5,352,987 A | 10/1994 | Harvey | 330/51 |
| 5,623,229 A | 4/1997 | Murray | 330/255 |
| 5,623,232 A | 4/1997 | Halbert et al. | 330/307 |
| 5,627,495 A | 5/1997 | Halbert et al. | 330/307 |
| 5,654,671 A | 8/1997 | Murray | 330/255 |
| 5,686,974 A | 11/1997 | Nayebi et al. | 348/705 |
| 5,736,902 A | 4/1998 | Graeme | 330/296 |
| 5,786,729 A | 7/1998 | Smith | 330/255 |
| 5,801,571 A | 9/1998 | Allen et al. | 327/407 |
| 5,907,262 A | 5/1999 | Graeme et al. | 330/255 |

FOREIGN PATENT DOCUMENTS

| | | | | |
|---|---|---|---|---|
| EP | 0 851 434 A2 | 7/1998 | | G11C/27/02 |
| JP | 10-188589 | 7/1998 | | G11C/27/02 |

OTHER PUBLICATIONS

AD8184, 700 MHz, 5mA 4–to–1 Video Multiplexer, Analog Devices, Inc., 1997, pp. 1–12.
AD8170/AD8174, 250 MHz, 10ns Switching Multiplexer w/Amplifier, Analog Devices, Inc., 1996, pp. 1–15.
AD8108/AD8109, 325 MHz, 8×8 Buffered Video Crosspoint Switches, Analog Devices, Inc., 1997, pp. 1–26.

* cited by examiner

Primary Examiner—Tuan T. Lam
Assistant Examiner—Terry L. Englund
(74) Attorney, Agent, or Firm—W. Daniel Swayze, Jr.; W. James Brady; Frederick J. Telecky, Jr.

(57) ABSTRACT

A circuit for multiplexing a selected one of a plurality of input signals to an output conductor includes a plurality of diamond follower input buffers each having an input terminal coupled to receive an input signal, respectively. A diamond follower output buffer has an output coupled to the output conductor. A feedback resistor is coupled between the output conductor and the outputs of the input buffers. A first current mirror has a control input coupled to a first current bias terminal of each input buffer, and a second current error has a control input coupled to a second current bias terminal of each input buffer. The first and second current mirrors have outputs connected to drive the input of the output buffer and bias current terminals of the output buffer to provide a high slew rate.

13 Claims, 8 Drawing Sheets

HIGH-SPEED CLOSED LOOP SWITCH AND METHOD FOR VIDEO AND COMMUNICATIONS SIGNALS

BACKGROUND OF THE INVENTION

The invention relates to high speed closed loop multiplexer circuits for analog and digital video and communications signals.

Perhaps the closest prior art is U.S. Pat. No. 4,572,967 (Metz), which discloses a bipolar analog multiplexor circuit that includes three analog inputs, one of which is selected to be switched to an analog signal output conductor 32 in response to one of three switch control signals. Each analog input is coupled to the base of one transistor of a differential pair of emitter-coupled transistors. The switch control signals operate to "select" one of the differential pairs by connecting its emitters to a single current source, making that differential pair operative as an amplifying stage. This type of analog switch can be referred to as a "switched gm" analog multiplexor circuit.

This type of prior art analog multiplexor circuit has the problem that it provides a very poor slew rate. That is, the output current provided to a capacitive load is inadequate to rapidly charge the capacitive load in response to a fast transition of the analog input signal. The slew rate is limited by the above mentioned single current source. Other references of interest include U.S. Pat. No. 4,367,419 (Yazawa et al.), U.S. Pat. No. 5,686,974 (Nayebi et al.), U.S. Pat. No. 3,638,131 (Sarkissian), U.S. Pat. No. 3,783,307 (Breuer) and U.S. Pat. No. 4,349,750 (Geurts).

The prior art technique of using a number N of open-loop buffers to switch one of N inputs to a selected output has the shortcoming that in order to achieve an appreciable output current, the output transistors have to be large, and since the N transistors are connected in parallel, the output capacitance becomes unacceptably large. An alternative technique of having one of N open-loop buffers followed by an amplifier has the shortcoming that this technique makes it very difficult to simultaneously provide suitable bias current, slew rate, bandwidth, and noise performance. Also, for large arrays, the capacitive loading for even small-geometry output transistors becomes excessive.

Prior multiplexor circuits commercially available from Analog Devices, Inc. can be obtained in 8 by 8 array configurations and in 16 by 16 array configurations. These devices use a switched gm architecture, and have poor channel-to-channel isolation of unselected inputs from the selected output, and also have the problems of very poor output slew rates and very poor load driving capability.

There has long been a need for very high-speed linear switching or multiplexing of video signals and both digital and analog communication signals. However, at the present time only high-speed multiplexor circuits having open-loop architectures or switched gm architectures have been available. Unfortunately, multiplexor circuits with open-loop switches are very non-linear when any significant load is driven, and multiplexor circuits with switched gm stages are linear but have very poor slew rates.

Thus, there remains an unmet need for a very high-speed linear multiplexer circuit for multiplexing video signals, analog communication signals, and digital communications signals. Further, there remains an unmet need for such a very high-speed linear multiplexer circuit that is expandable to switch one of a plurality of input signals to one of a plurality of output signals without substantially decreasing bandwidth, slew rate, and load driving capability of the output stage of the multiplexor circuit.

SUMMARY OF THE INVENTION

Accordingly, it is an object of the invention to provide a very high-speed linear multiplexer circuit for switching video signals, analog communication signals, and digital communication signals.

It is another object of the invention to provide a very high-speed linear multiplexer circuit which provides a high output slew rate.

It is another object of the invention to provide a very high-speed linear multiplexer circuit which provides the combination of high bandwidth and high slew rate.

It is another object of the invention to provide a very high-speed linear multiplexer circuit which provides the combination of high bandwidth, high slew rate, and high load driving capability.

It is another object of the invention to provide a very high-speed linear multiplexor circuit having high bandwidth, high slew rate, high load driving capability, and also having the capability of being expandable to form an array including a plurality of selectable inputs any one of which can be switched to any one of a plurality of selectable outputs, with little degradation of performance.

Briefly described, and in accordance with one embodiment thereof, the invention provides a circuit (10A,B) for multiplexing a selected one of a plurality of input signals to an output conductor (20). A plurality of input buffers (11-1, 2 ... N) each have an input terminal coupled to receive an input signal (Vin1,2 ... N), respectively, and each input buffer has a low impedance output terminal (21). Switched bias current circuitry (100) is coupled to the input buffers for providing an operating (+) bias current and an operating (−) bias current for a selected one of the input buffers in response to a selection control signal (INi) and also for preventing flow of operating (+) bias current and operating (−) bias current in the input buffers which are not presently selected. An output buffer (16) includes an output coupled to the output conductor (20), an input (17), and first (18) and second (19) bias terminals. A feedback resistor (RFB) is coupled between the output conductor (20) and the low impedance outputs (21) of the input buffers (11). A first current mirror (14) includes a control input coupled to a first bias terminal (11C) of each of the input buffers, a first output coupled to the input (17) of the output buffer (16), and a second output coupled to the first bias terminal (18) of the output buffer (16). A second current mirror (15) includes a control input coupled to a second bias terminal (11D) of each of the input buffers, a first output coupled to the input (17) of the output buffer (16), and a second output coupled to the second bias terminal (19) of the output buffer (16).

In another embodiment, a circuit (10D) for multiplexing a selected one of a plurality of input signals to an output conductor (20) includes a plurality of diamond follower input buffers (11-1,2 ... N) each having an input terminal coupled to receive an input signal (Vin1, 2 ... N), respectively. Each diamond follower input buffer has a low impedance output terminal (21), and first (11A), second (11B), third (11C) and fourth (11D) bias terminals. A first conductor (12) is coupled to the third bias terminal (11C) of the each diamond follower input buffer, and a second conductor (13) is coupled to the fourth bias terminal (11D) of each diamond follower input buffer. A diamond follower output buffer (16) has an output coupled to the output conductor (20), an input (17), and first (18) and second (19) bias terminals. A first current mirror (14) has a control input coupled to the first conductor (12), a first output coupled to the input (17) of the diamond follower output buffer (16), and a second output coupled to the first bias terminal (18) of the diamond follower output buffer (16). A second current mirror (15) has a control input coupled to the second conductor (13), a first output coupled to the input (17) of the diamond follower output buffer (16), and a second output coupled to the second bias terminal (19) of the diamond follower output buffer (16). The feedback resistor (RFB) is coupled between the output conductor (20) and the low impedance outputs (21) of the diamond follower input buffers (11). A first group of switches (S1,3 . . . j) selectively enables the first bias terminals (11A) of the diamond follower input buffers to corresponding operating (+) bias current sources in response to a plurality of enable signals (I N1,2 . . . N), and a second group of switches (S2,4 . . . k) selectively enables the second bias terminals (11B) of the diamond follower input buffers to corresponding operating (−) bias current sources in response to the plurality of enable signals, respectively.

DETAILED DESCRIPTION OF THE PREFERRED EMBODIMENTS

Figure 1A:
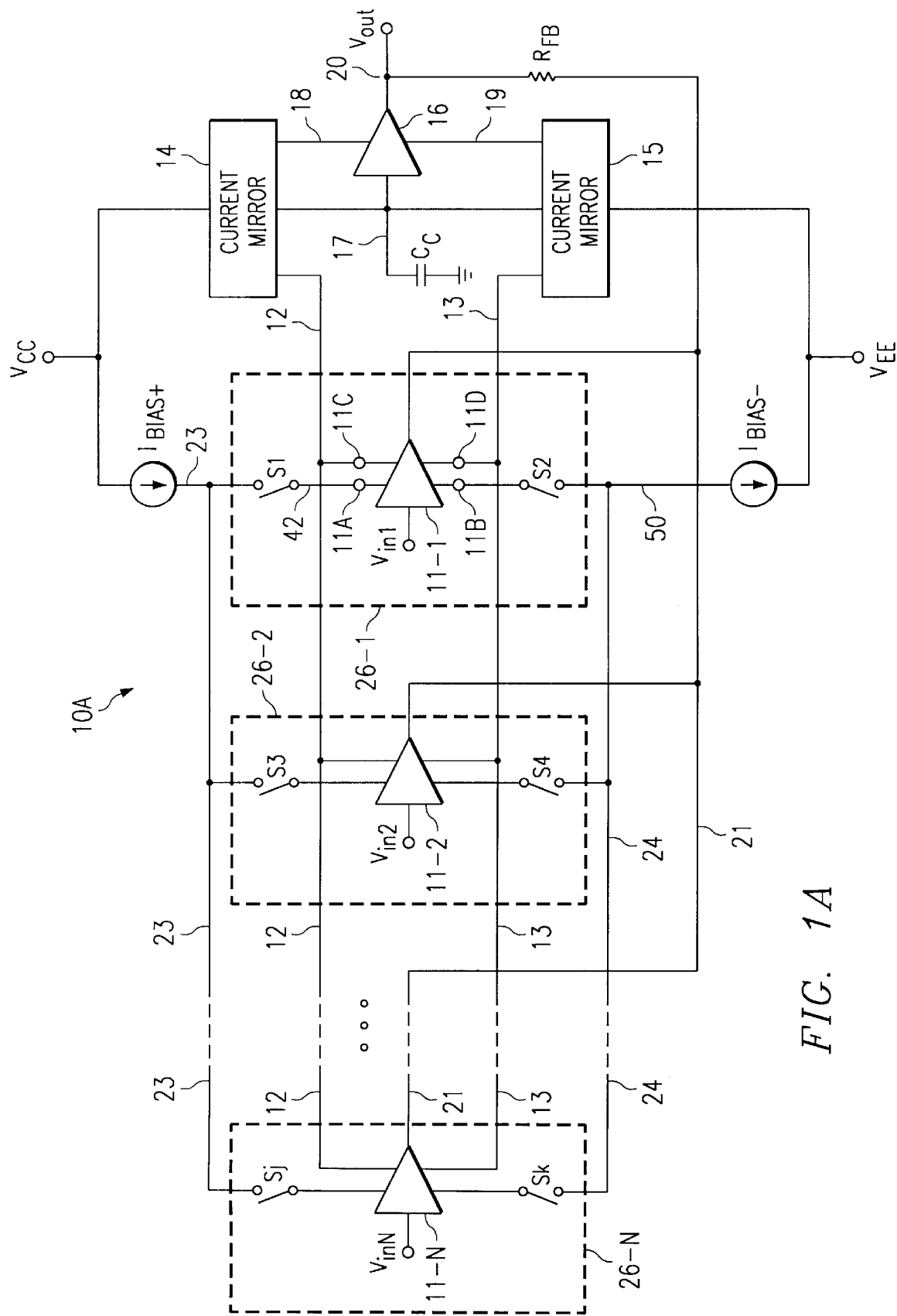
FIG. 1A is a block diagram and of an N by 1 multiplexer circuit according to the invention.

Referring to FIG. 1A, closed loop multiplexor circuit 10A includes N input signals $V_{in1}$, $V_{in2}$ . . . $V_{inN}$ and a single output $V_{out}$ produced on conductor 20. Output conductor 20 is driven by a conventional diamond follower output buffer 16, the details of which are shown in FIG. 2. Output buffer 16 receives its input from "upper" current mirror 14 and "lower" current mirror 15 through conductor 17. Conductor 17 is connected to both a first output of upper current mirror 14 and a first output of a lower current mirror 15. A second output of current mirror 14 provides a bias current via conductor 18 to a first bias input of diamond follower output buffer 16. A second current output of current mirror 15 sinks a second bias current via conductor 19 from a second bias current terminal of diamond follower output buffer 16. Conductor 17 also is connected to one terminal of a compensation capacitor $C_C$, the other terminal of which is connected to ground.

Upper current mirror 14 is referenced to $V_{CC}$, and lower current mirror 15 is referenced to $V_{EE}$. The control terminal of upper current mirror 14 is connected to conductor 12, and the control terminal of lower current mirror 15 is connected to conductor 13.

The N input signals $V_{in1,2 \ldots N}$ preferably are connected to inputs of N input buffers 11-1,2 . . . N, respectively, wherein 26-1 to 26-N each represent a switched input buffer circuit. Input buffers 11-1,2 . . . N preferably are diamond follower circuits or modified diamond follower circuits, each of which has a first bias current terminal 11C connected to conductor 12 and a second bias current terminal 11D connected to conductor 13. (A variety of diamond follower buffer circuits are well-known to those skilled in the art. For example, see U.S. Pat. Nos. 4,639,685 and 5,003,269.) By way of definition, the term "diamond follower" or "diamond follower circuit" as used herein is intended to encompass circuits commonly known as diamond followers, and also to encompass modified versions thereof, for example is shown in above-mentioned U.S. Pat. Nos. 4,639,685 and 5,003,269.

Still referring to FIG. 1A, an upper bias current source $I_{BIAS}^+$ connected to $V_{CC}$ is selectively coupled by one of N switches such as S1, S3, . . . Sj to a third bias current terminal 11A of the corresponding buffer circuit 11-1,11-2, or 11-N, respectively. Similarly, a lower bias current source $I_{BIAS}^-$ connected to $V_{EE}$ is selectively coupled by one of N switches such as S2, S4, . . . Sk to a fourth bias current terminal 11B of a corresponding one of the input buffers 11-1,2 . . . N 11-1,11-2, or 11-N, respectively.

A suitable switch control circuit, shown and subsequently described with reference to FIG. 3, can be used to generate control signals capable of operating the various switches S1,2 . . . k so as to connect one of the input buffers 11-1,2 . . . N to the bias current sources $I_{BIAS}^+$ and $I_{BIAS}^-$ so that the analog input signal $V_{Ini}$ (where I can have a value 1,2 . . . N) applied to that input buffer is reproduced as $V_{out}$ on conductor 20.

A feedback resistor $R_{FB}$ is coupled between $V_{out}$ conductor 20 and a control conductor 21 of each of the diamond follower input buffer circuits 11-1,2 . . . N, and is operative to cause that diamond follower input buffer to drive current mirror circuits 14 and 15 so they cause output buffer 16 to provide a rapid change in $V_{out}$ in response to a rapid change in the analog input signal $V_{ini}$. The rise time or fall time of the output signal Vout is nearly equal to that of the input signal Vin1, 2 . . . N even with a large capacitance load, so there is no slew rate problem.

The current feedback operation of multiplexer circuit 10A of FIG. 1A, assuming that input buffer 11-1 is switched on and the remaining input buffers are switched off, is described next. For example, if $V_{in1}$ is increasing, that causes the output voltage produced on conductor 21 by input buffer 11-1 to rise to voltage greater than $V_{out}$. That causes input buffer 11-1 to supply a feedback current from conductor 21 through feedback resistor $R_{FB}$ to output conductor 20.

The structure of diamond follower input buffer 11-1 is such that all of the above feedback current supplied by input buffer 11-1 also flows out of the control terminal of upper current mirror 14 through conductor 12, through bias current terminal 11C, and through conductor 21 and feedback resistor $R_{FB}$ to output conductor 20. Current mirror 14 accordingly produces mirrored output currents through conductors 17 and 18, which both are equal to (or proportional to) the feedback current through feedback resistor $R_{FB}$. The current mirror output current through conductor 17 rapidly charges compensation capacitor $C_C$, allowing the input voltage of output buffer 16 to respond very rapidly to the rapid increasing of $V_{in1}$.

Also, the current mirror output current through conductor 18 rapidly provides sufficient bias current to diamond follower output buffer 16 to provide a very high "slew up" rate for the output voltage $V_{out}$, even if a large capacitance load (not shown) is connected to output conductor 20.

If $V_{in1}$, is rapidly decreasing rather than increasing, then the direction of the feedback current is opposite to that described above. In this case, the feedback current flows from output conductor 20 through feedback resistor $R_{FB}$ into conductor 20, through bias current terminal 11D of input buffer 11-1, through conductor 13 into the control terminal of lower current mirror 15. Lower current mirror 15 therefore rapidly discharges compensation capacitor $C_C$, and also provides a very high "slew down" rate for the output voltage $V_{out}$, even if a large capacitance load is connected to output conductor 20.

Compensation of the high speed closed loop multiplexor circuit 10A is determined by the internal feedback resistor $R_{FB}$ plus the parasitic input resistance of output buffer 16, and also by the compensation capacitor $C_C$ plus the parasitic capacitance of the high impedance node 17. In one embodiment, the amplifier is compensated to a normal bandwidth of 900 MHZ. Note that other input buffer circuits than diamond follower buffer circuits could be utilized for output buffer 16 and/or the input buffer amplifiers 11-1,2 ... N. However, it is necessary that the output buffer 16 and/or the input buffers 11-1,2 ... N have low output impedances and that each buffer includes four bias terminals.

Figure 1B:
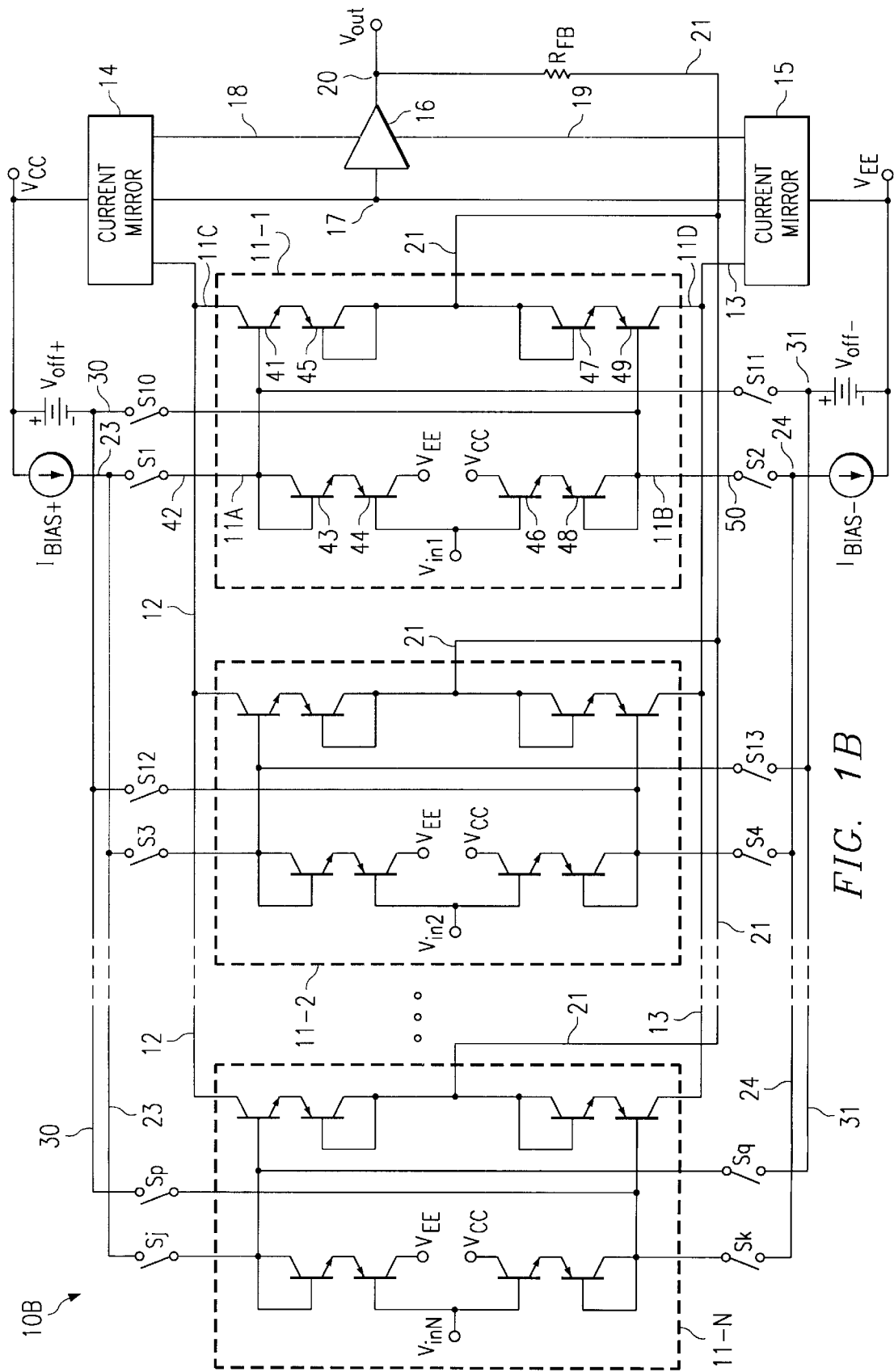
FIG. 1B is a schematic diagram of one circuit implementation of the multiplexer circuit of FIG. 1A.
Figures 1, 1C:
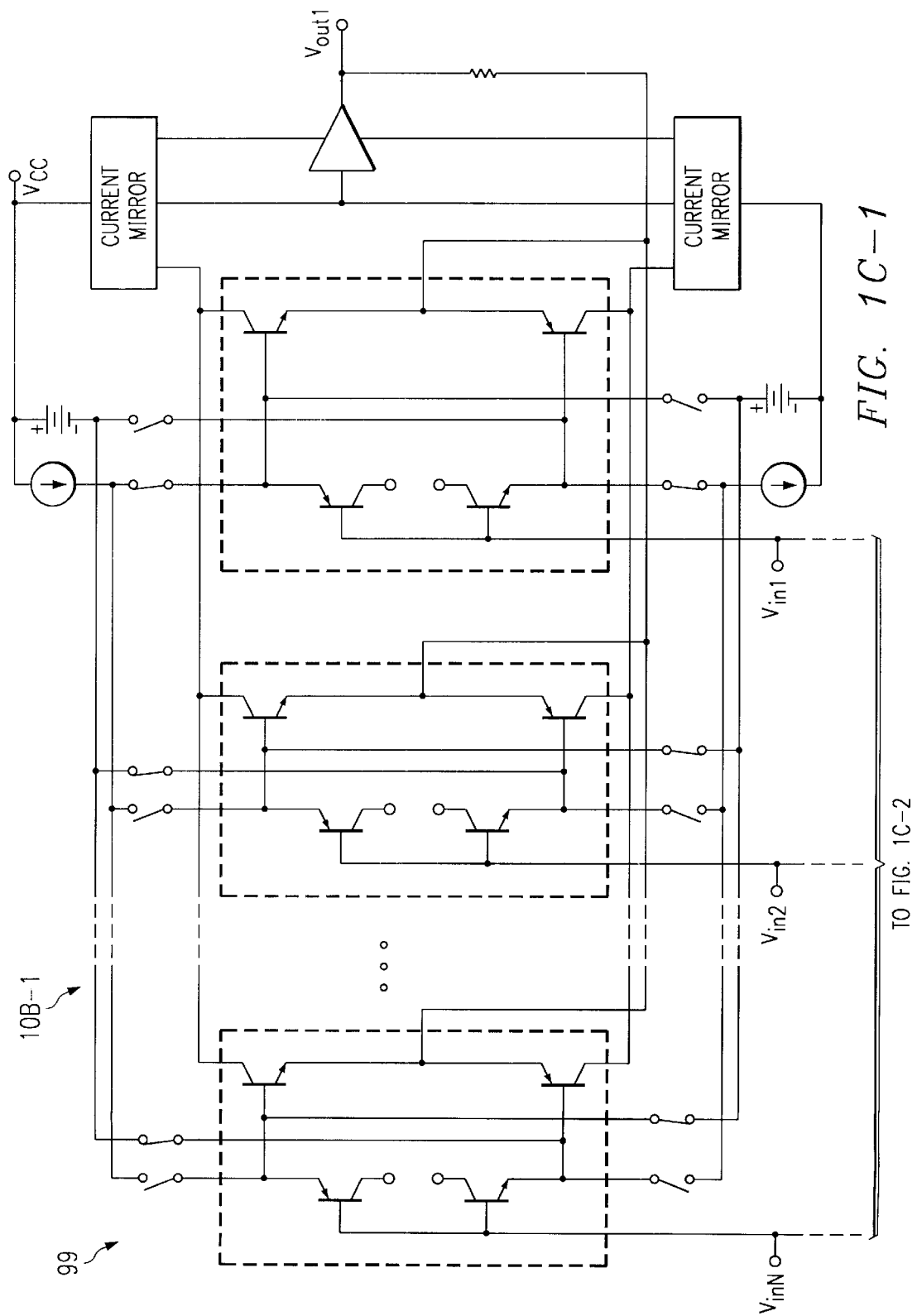
FIG. 1C is a schematic diagram of an N by M multiplexer circuit according to the invention.
Figures 1, 1C, 2:
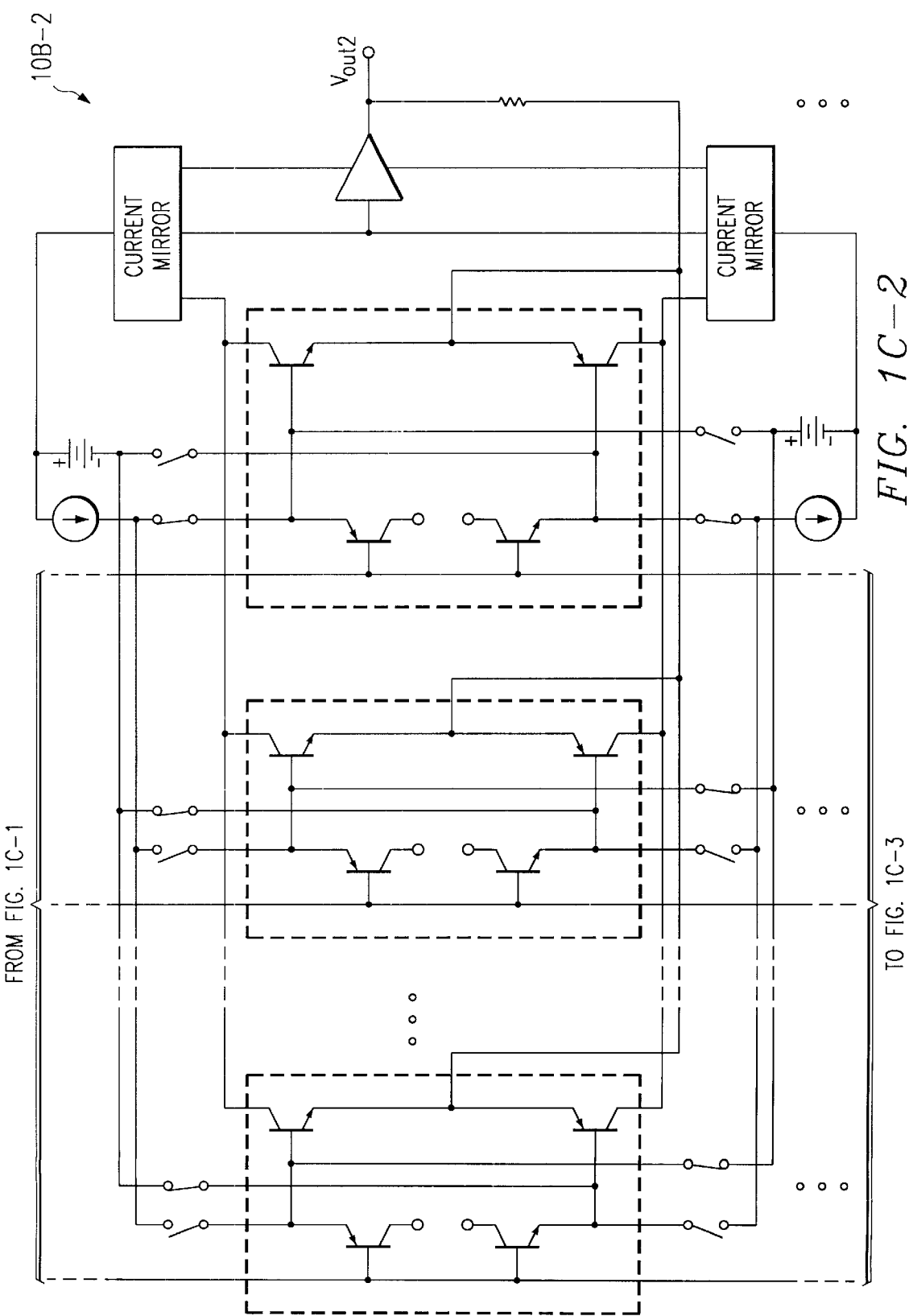
FIG. 2 is a schematic diagram of the diamond follower output stage 16 of FIGS. 1A–D.

FIG. 1B shows a more detailed implementation of FIG. 1, in which the diamond follower buffer circuits 11-1,2 ... N of FIG. 1A are shown in detail within dashed lines 11-1, 11-2 ... 11-N in FIG. 1B. In the implementation shown in FIG. 1B, diamond follower buffer 11-1 includes an NPN transistor 41 having its collector connected to conductor 12, its emitter coupled by a diode-connected transistor 45 to conductor 21, its base connected by conductor 42 to switch S1 and by diode-connected transistor 43 to the emitter of a PNP transistor 44. Similarly, current mirror control conductor 13 is connected to the collector of a PNP transistor 49 having its emitter connected by a diode-connected transistor 47 to conductor 21. The base of transistor 49 is connected by conductor 50 to switch S 2 and by diode-connected transistor 48 to the emitter of NPN transistor 46. The collector of PNP transistor 44 is connected to the lower supply voltage $V_{EE}$, and the collector of transistor 46 is connected to the upper power supply rail $V_{CC}$. The bases of both transistors 44 and 46 are connected to $V_{In1}$. The remaining buffers are identical to buffer 11-1. (The diode-connected transistors 45, 47, 43 and 48 are not essential, but are included in the preferred implementation to provide increased resistance to emitter-base reverse breakdown in "off" channels having large input signals present.) The bias terminals 11B of the diamond follower input buffers 11-1,2 ... N are selectively coupled by switches S10,12 ... p through line 30 to the (−) terminal of a reference voltage source $V_{OFF+}$ which is referenced to $V_{CC}$. Similarly, the bias terminals 11A of the diamond follower input buffers 11-1,2 ... N are selectively coupled by switches S11,13 ... q through line 31 to the (+) terminal of a reference voltage source $V_{OFF-}$. (Alternatively, these reference voltages could be referenced to ground.) The upper buffer input bias rail 42 is connected to $V_{OFF-}$ when the channel is off. Thus, in an off channel, negative input signals of magnitude $V_{EE}+V_{OFF}-(_{VBE(Q43)}+V_{BE(Q44)})$ can be held off, i.e., can be prevented from being coupled to the output 20. Similarly, the lower input buffer bias rail 50 is connected to $V_{OFF+}$ when the channel is off, and positive input signals of magnitude $V_{CC}-V_{OFF}+(V_{BE(Q46)}+V_{BE(Q48)})$ also can be prevented from being coupled to the output 20.

FIG. 1C shows how three of the multiplexor circuits of FIG. 1A or FIG. 1B can be connected together to provide an M×N multiplexor 99 in which a particular selected input voltage $V_{in-1,2 ... N}$ can be switched to a particular selected output terminal Vout1,2 ... M.

Figures 1, 1C, 2, 3:
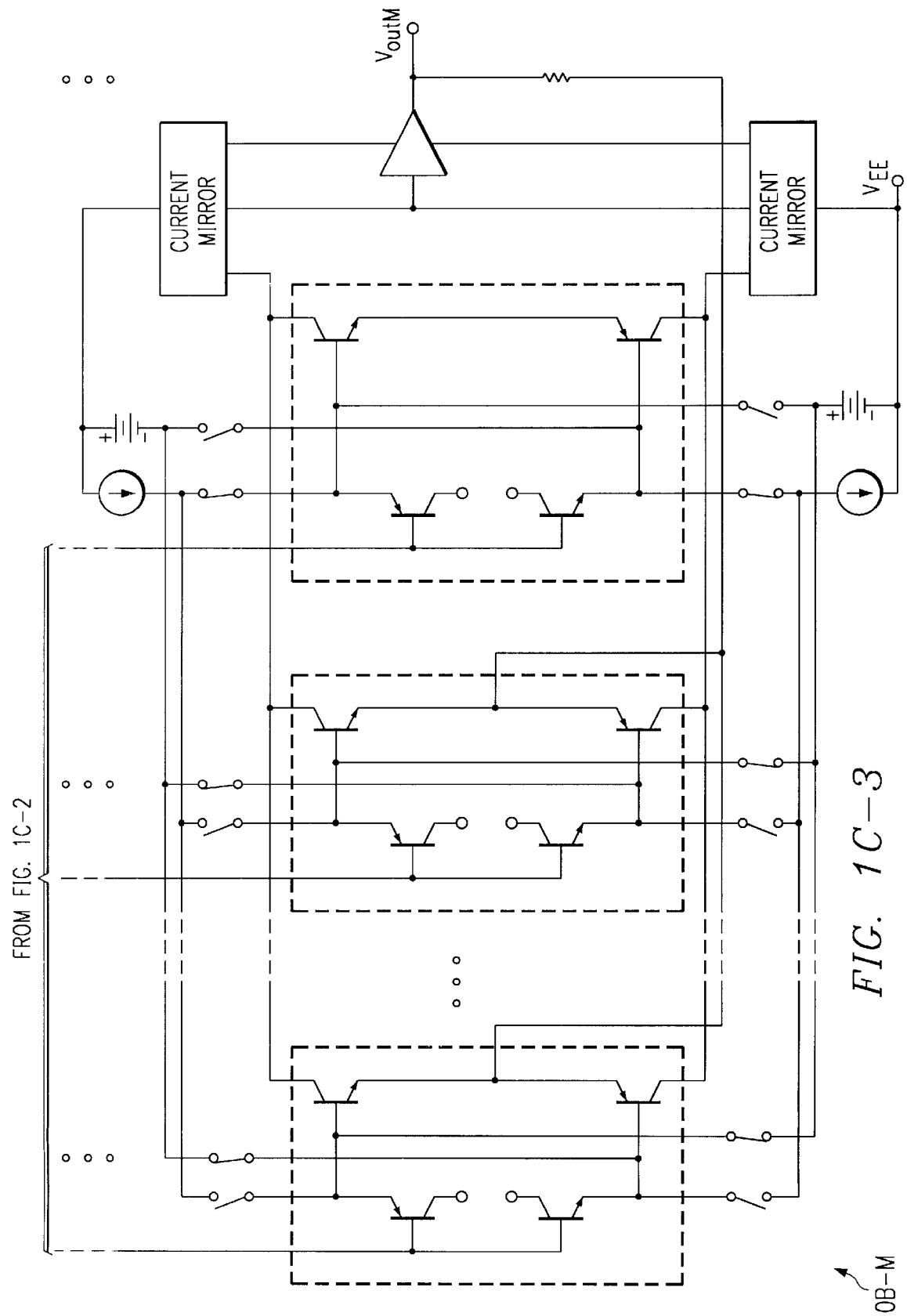
FIG. 3 is a schematic diagram of one of the switching cells in FIG. 1D.
Figure 1D:
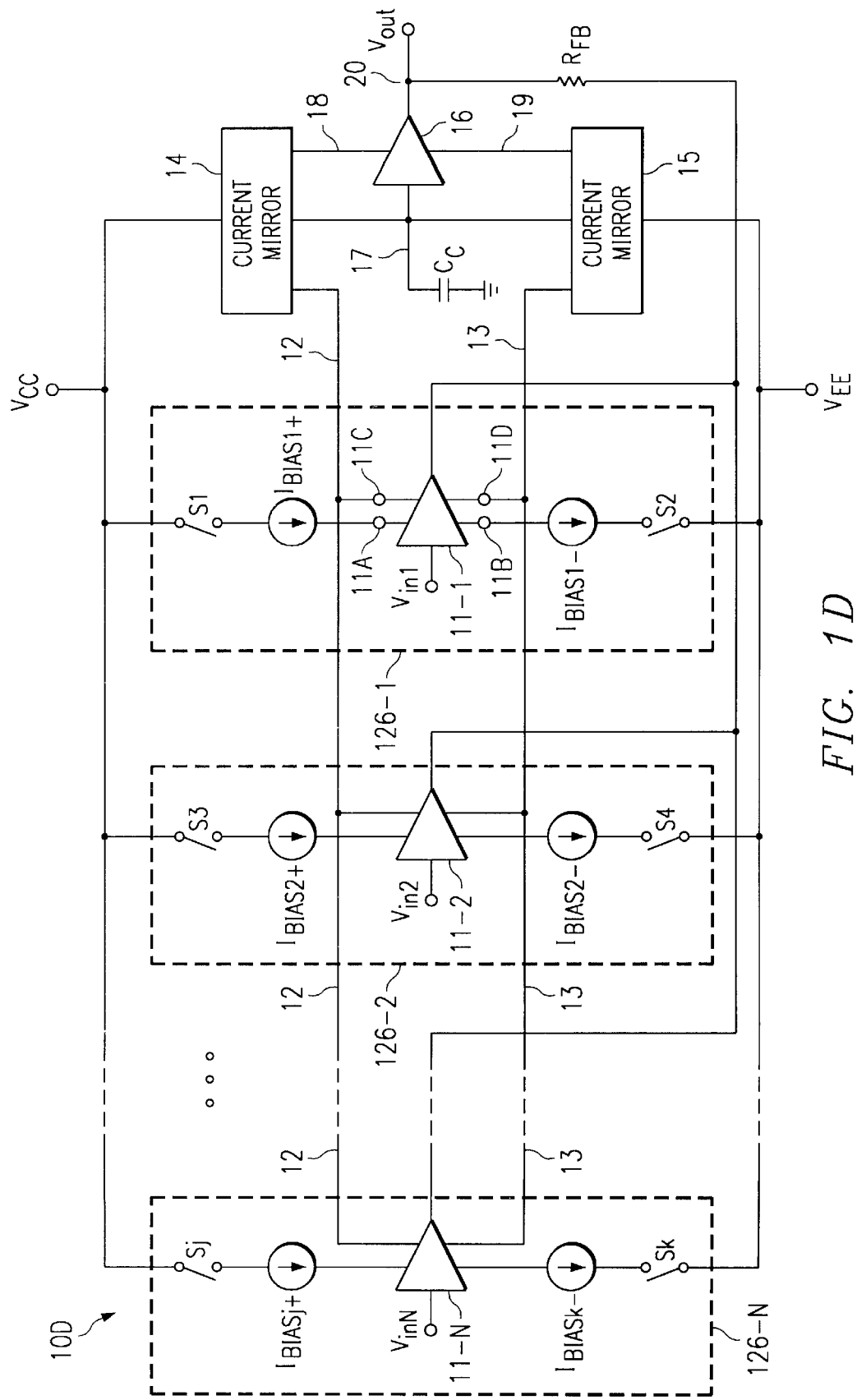
FIG. 1D is a block diagram of another N by 1 multiplexer circuit according to the invention.
Figure 2:
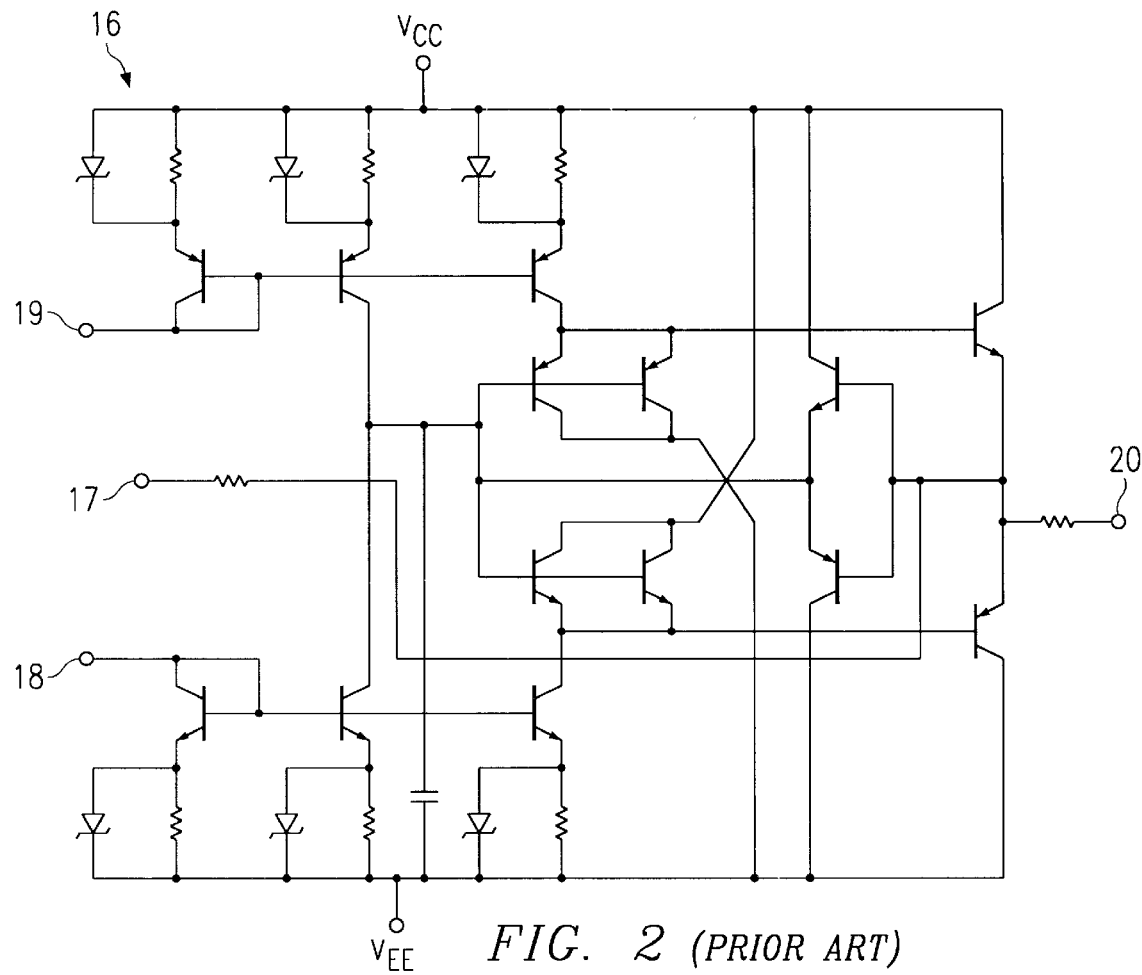

FIG. 1D shows a block diagram of an alternative, and in some cases preferred, implementation of the multiplexor circuit 10A of FIG. 1A. Referring to FIG. 1D, the structure and operation of multiplexor 10D are essentially the same as multiplexor 10A. However, in multiplexor 10D of FIG. 1D, a separate pair of bias current sources is included in each of switched input buffer circuits 126-1,2 ... N. Specifically, in switched input buffer circuit 126-1, bias current source $I_{BIAS1+}$ is switched by switch S1 to $V_{CC}$ and bias current source $I_{BIAS1-}$ is switched by switch S2 to $V_{EE}$. Similarly, in switched input buffer circuit 126-2, bias current source $I_{BIAS2+}$ is switched by switch S3 to $V_{CC}$ and bias current source $I_{BIAS2-}$ is switched by switch S4 to $V_{EE}$, and in switched input buffer circuit 126-N, bias current source $I_{BIASj+}$ is switched by switch Sj to $V_{CC}$ and bias current source $I_{BIASk-}$ is switched by switch Sk to $V_{EE}$. (In FIG. 1D, the combination of a switch such as switch Sj and a current source such as $I_{BIASj+}$ represents a switched current source, which can be easily provided by one skilled in the art.)

FIG. 3 shows a schematic diagram of a combined input buffer and switched bias current source circuit 126-I that is included in each of switched input buffer circuits 126-1, 2 ... N, where I is equal to 1,2 ... N. Referring to FIG. 3, switched input buffer circuit 126-I includes an enable input conductor 113, a first output that is connected by conductor 12 to the control input of upper current mirror 14, and a second output that is connected by conductor 13 to the control input of lower current mirror 15.

Circuits 11-1 and 11-2 together constitute a diamond follower input buffer 11-1,2 which includes additional diode-connected transistors 43, 48, 45 and 47 which are provided to increase the reverse voltage breakdown capability of the diamond follower input buffer 11-1,2. Transistors 44 and 46 are the input transistors of the diamond follower input buffer, and transistors 41 and 49 are the output transistors thereof. The input voltage Vini is the input of the diamond follower input buffer 11-1,2. Conductor 21 is the low impedance output of diamond follower input buffer 11-1,2.

The circuitry within dashed line 112 constitutes a current mirror, and the circuitry within the dashed line 114 constitutes another current mirror. The control inputs of current mirrors 112 and 114 are connected to the terminals of a constant current source 110. The output terminal of current mirror 112 is connected by bias terminal 11B to the collector and base of transistor 48 and to the base of transistor 49 of diamond follower input buffer 11-1,2. The output of current mirror 114 is connected by bias terminal 11A to the collector and base of transistor 43 and the base of transistor 41 of input buffer 11-1,2.

A constant current source 110 develops a low-level current by impressing a voltage equal to $V_{CC}-V_{EE}-6V_{BE}$ across resistor 121. This keeps the "switch off current sources" 112 and 114 on at all times, even when the switch is active, so as to improve operating speed. The circuitry within dashed line 120 is a clamp circuit connected between ground and conductor 11A and operates to prevent output transistor 114A of current mirror 114 from becoming saturated, and similarly, the circuitry within dashed line 122 is another clamp circuit connected between ground and conductor 11B to prevent transistor 112A of current mirror 112 from becoming saturated. This allows switched input buffer circuit 126-I to be rapidly switched from an off condition to an on condition when its input voltage $V_{ini}$ is selected to be multiplexed to output conductor 20. These clamp circuits also function as the $V_{OFF}$ voltage references shown in FIG. 1B. Here, they are referenced to ground rather than the supply rails $V_{CC}$ and $V_{EE}$, and are active only in the "off" channels.

The remaining circuitry shown in FIG. 3 constitutes bias current switching circuitry 100 which includes an enable circuit 109 and a constant current source 101. Enable circuit 109 includes enable input conductor 113 connected to anode of a Schottky diode 117 and one terminal of a resistor 119. The other terminal of resistor 119 is connected to the collector and base of a PNP transistor 118, the emitter of which is connected to the control input of a VBE/R constant current source 1 01. The emitter of transistor 118 also is connected to the cathode of Schottky diode 117 and to one terminal of a capacitor 116, the other terminal of which is connected to $V_{CC}$. Enable circuit 109, when one switch circuit is turning on to couple one video input signal to the output 20 and another switch circuit is turning off to decouple another video input signal from the output 20, performs a "break before make" operation by producing a delay so that one switch circuit is turned off before the other is completely turned on. This reduces a switching "glitch" signal.

Figure 4:
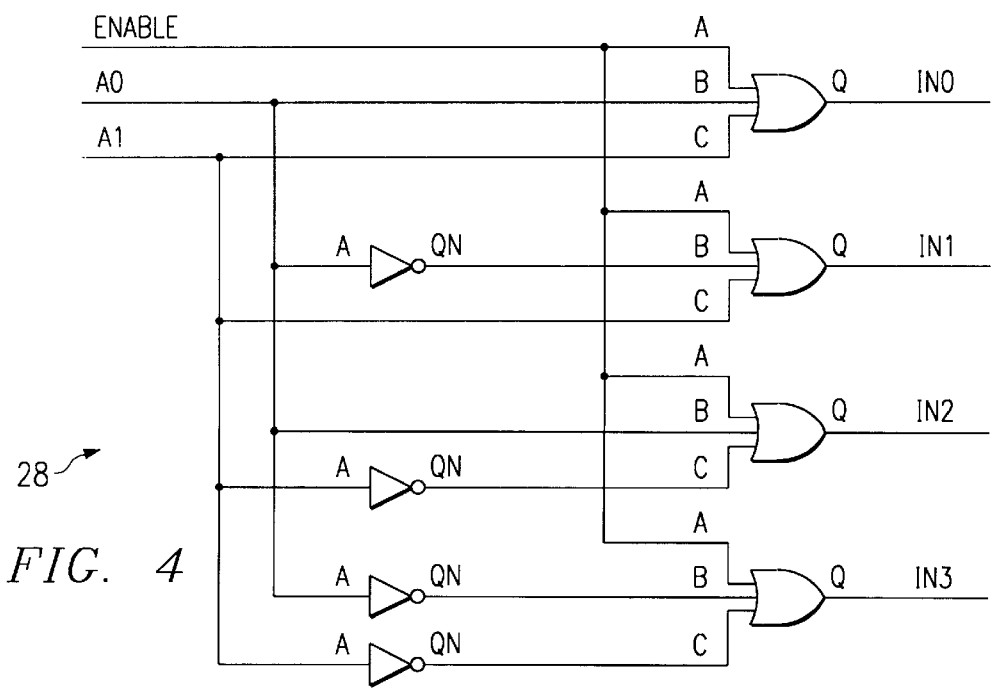
FIG. 4 is a logic diagram of the control circuit for controlling the switches in FIG. 1A and FIG. 1D.
Figure 3:
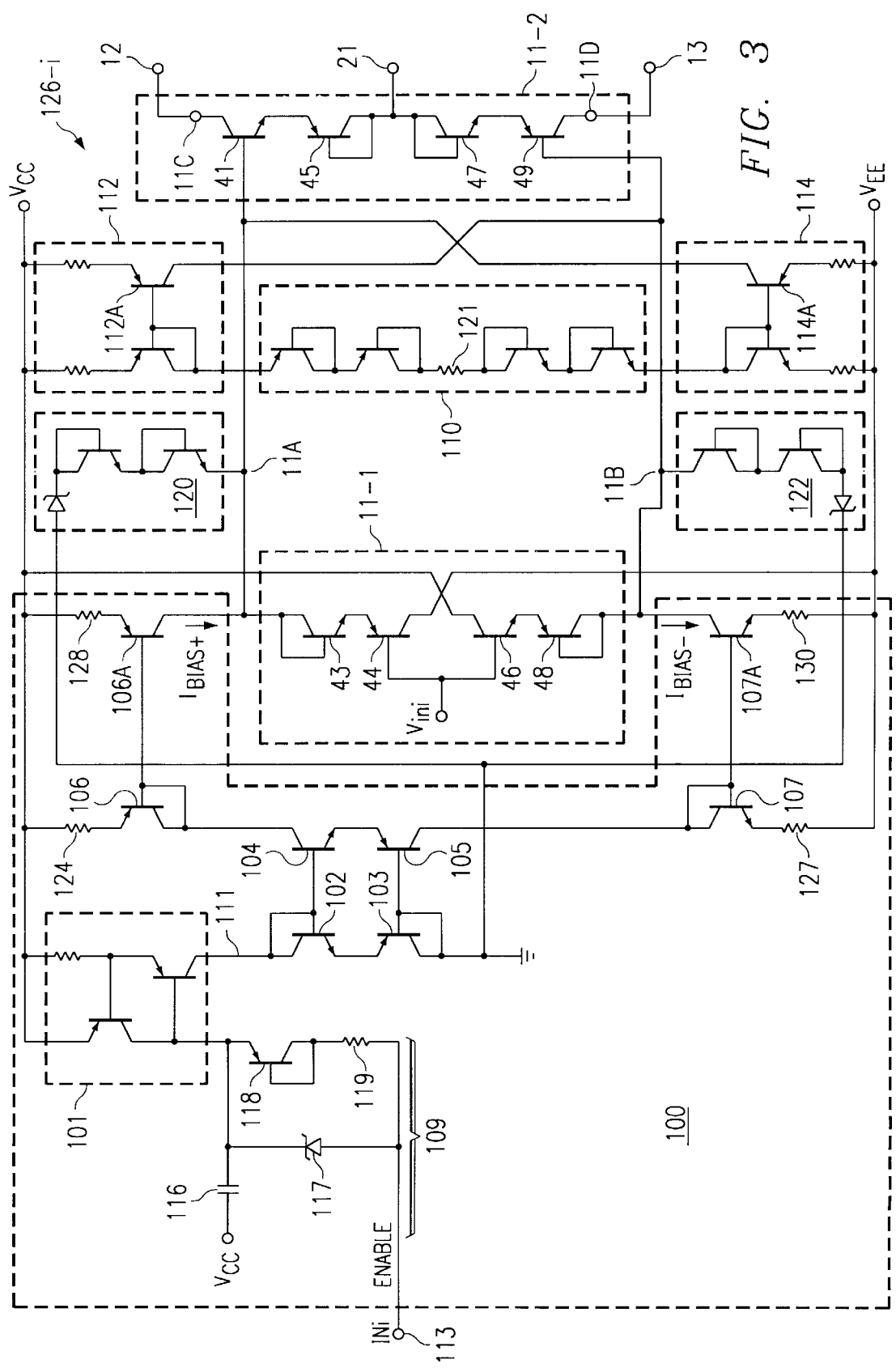

When the input signal INi applied by the control circuit 28 of FIG. 4 to enable conductor 113 of switched input buffer circuit 126-I is low, VBE/R constant current source 101 of FIG. 3 is turned on, and the current supplied by it flows from its output terminal 111 through diode-connected NPN transistor 102 and diode-connected PNP transistor 103 to ground. The bases of transistors 102 and 103 are connected to the bases of NPN transistor 104 and PNP transistor 105, respectively, which finction together to provide precisely equal control currents in the control terminals of two current mirrors. The first current mirror includes diode-connected PNP transistor 106, PNP transistor 106A, resistor 124 connected between $V_{CC}$ and the emitter of transistor 106, and resistor 128 coupled between the emitter of transistor 106A and $V_{CC}$. The second current mirror includes diode-connected PNP transistor 107, PNP transistor 107A, resistor 127 coupled between the emitter of transistor 107 and $V_{EE}$, and resistor 130 coupled between the emitter of transistor 107A and $V_{EE}$. The collector of transistor 106A is connected to conductor 11A to selectively provide the positive bias current $I_{BIAS+}$ into the bias terminal 11A of diamond follower 11-1,2 in response to the selection control signal INi applied to enable conductor 113. The collector of transistor 107A is connected to bias terminal 11B to selectively sink the negative bias current $I_{BIAS-}$ from input buffer 11-1,2 in response to the selection control signal INi applied to enable conductor 113.

The above described structure of switched input buffer circuit 126-I provides very fast, clean, symmetrical multiplexing of the input voltage Vini applied to any one of the diamond followers 11-1,2 in multiplexor 10D of FIG. 1D to the output conductor 20.

Digital control of the high speed closed loop multiplexer circuit 10A shown in FIG. 1A and also the high speed closed loop multiplexer circuit 10D shown in FIG. 1D is accomplished by a conventional control circuit 28 shown in FIG. 4, which implements the following truth table.

TABLE 1

| A1 | A0 | OUT |
|----|----|-----|
| 0  | 0  | IN0 |
| 0  | 1  | IN1 |
| 1  | 0  | IN2 |
| 1  | 1  | IN3 |

The control circuit of FIG. 4 controls the pairs of switch circuitry that connect the respective multiple buffers to the bias circuit.

The above-described invention provides a the combination of current feedback through $R_{FB}$ to one or more diamond follower input buffers 11 (one at a time), controlling the two current mirrors in response to the current feedback by means of the bias currents of the selected diamond follower input buffer, and controlling a diamond follower output buffer 16 in response to the outputs of the two current mirrors to produce $V_{out}$. The described circuit is capable of switching both high-speed video AC signals and also high-speed digital signals. A present implementation of the invention achieves a bandwidth of 600 MHZ at full power. It also achieves approximately 100 dB of isolation between an unselected input signal and the output signal. It also achieves an output slew rate of as much as 1500 volts per microsecond. The described embodiments of the invention is capable of driving a video signal into a conventional 75 ohm impedance of a video load.

In the current feedback architecture of the present invention, the "small signal" performance is extended to equal that of the large signal performance, because whatever current is needed to slew the capacitances is supplied by the output stage. The current feedback from the output conductor combined with the use of a diamond input buffer circuit allows almost instant correction of the output signal relative to the input signal because of the way the diamond follower circuits operates. This results in immediate corrective signals into the control inputs of each of the current mirror circuits, which in turn causes the output signal Vout to be essentially equal to the input signal Vin for both large signal operation and small signal operation. Consequently, the slew rate of the output amplifier 16 is nearly equal to the rise time of the input signal.

This is in contrast to the above described switched gm multiplexor circuits, wherein the slew rate is limited by the amount of tail current of the differentially coupled input transistors of the output amplifier flowing into the compensation capacitor thereof.

In accordance with the present invention, it was found that multiple input buffers could be paralleled at the low impedance input of the diamond follower input buffer utilized, and connected at that point to current mirror circuits connected to drive a diamond follower output buffer, wherein current feedback from the output could be applied to the low impedance input of the diamond follower output circuits. This provides a method for switching multiple input signals with the amplifier, and allows more efficient use of available current. This technique also reduces noise because the additional buffer required for the switched gm approach is eliminated from the signal path, and allows the bandwidth to be set, as in any conventional current feedback amplifier. This technique also has the advantage that the architecture is expandable to arrays for switching one of N inputs to one of M outputs.

The signal path to the active switch is essentially a gain-of-one current feedback amplifier. When the switch is active, one of the four switches has bias currents applied to the input stage, thus completing the signal path. The three off switches have their internal nodes clamped to a low impedance path to ground. This places reverse bias on the buffer input transistors and shunts the parasitic capacitance of these input transistors to the power supply. This provides maximum isolation between the active channel and signals present at the off channels.

Thus, the invention provides a solution to the shortcomings of the prior art by providing a high-speed linear multiplexor circuit having a closed loop architecture that results in a high slew rate, high bandwidth, and high load driving capability, and furthermore is expandable to arrays including multiple inputs and multiple outputs. The closed loop architecture includes multiple input buffer stages which make up the switches. The input buffers are paralleled into common current mirrors. The paralleled devices are connected to low impedance points (i.e., the input of the current mirror), thus minimizing the effects of the high capacitance that results from the paralleling of many devices. The on switch causes the current mirror and output stage to be powered, thus completing the signal path. The off channel signal is held off by reverse bias on the base lines of the input buffers. Using this technique, large arrays, such as an 8 by 8 array or a 16 by 16 array with very good large signal characteristics can be constructed while maintaining very good large signal performance.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention.

What is claimed is:

1. A circuit for multiplexing a selected one of a plurality of input signals to an output conductor, comprising:
   (a) a plurality of input buffers each having an input terminal coupled to receive of the input signals, respectively, each input buffer having a low impedance output terminal;
   (b) switched bias current circuitry coupled to the input buffers for supplying an operating (+) bias current into a first bias terminal of one of the input buffers and sinking an operating (−) bias current from a second bias terminal of the input buffer to select one of the input buffers in response to a selection control signal and preventing flow of the operating (+) bias current and the operating (−) bias current in the remaining input buffers which are not presently selected;
   (c) an output buffer having an output coupled to the output conductor, an input, and first and second bias terminals;
   (d) a feedback resistor coupled between the output conductor and the low impedance output terminals of the input buffers; and
   (e) a first current mirror having a control input coupled to a third bias terminal of each of the input buffers, a first output coupled to the input of the output buffer, and a second output coupled to the first bias terminal of the output buffer, and a second current mirror having a control input coupled to a fourth bias terminal of each of the input buffers, a first output coupled to the input of the output buffer, and a second output coupled to the second bias terminal of the output buffer.

2. The circuit of claim 1 wherein the input buffers are diamond follower input buffers.

3. The circuit of claim 2 wherein each input buffer includes a PNP first transistor having an emitter coupled to the first bias terminal of the input buffer, a base coupled to receive the respective input signal voltage of the input buffer, and a collector coupled to a first supply voltage, an NPN second transistor having an emitter coupled to the second bias terminal of the input buffer, a base coupled to receive the respective input signal voltage of the input buffer, and a collector coupled to a second supply voltage, an NPN third transistor having an emitter coupled to the low impedance output terminal of the input buffer, a base coupled to the first bias terminal of the input buffer, and a collector coupled to the control input of the first current mirror, and a PNP fourth transistor having an emitter coupled to the low impedance output terminal of the input buffer, a base coupled to the second bias terminal of the input buffer, and a collector coupled to the control terminal input of the second current mirror.

4. The circuit of claim 3 wherein each input buffer further includes an NPN fifth transistor having an emitter connected to the emitter of the first transistor and a collector and a base connected to the first bias terminal of the input buffer, a PNP sixth transistor having an emitter connected to the emitter of the second transistor and a base and collector connected to the second bias terminal of the input buffer, a PNP seventh transistor having an emitter connected to the emitter of the third transistor and a base and collector connected to the low impedance output terminal of the input buffer, and an NPN eighth transistor having a base and collector connected to the low impedance output terminal of the input buffer and an emitter connected to the emitter of the fourth transistor.

5. The circuit of claim 3 further including a standby current source coupled between the first bias terminal of each input buffer and the second bias terminal of each input buffer to prevent each input buffer from being completely unbiased when it is unselected.

6. The circuit of claim 1 wherein the output buffer is a diamond follower output buffer.

7. The circuit of claim 3 wherein the output buffer is a diamond follower output buffer.

8. The circuit of claim 1 wherein the switched bias current circuitry includes switched constant current source circuitry including a switchable constant current source having an output conductor, and also including a current source switch control circuit for switching the switchable constant current source on or off in response to the selection control signal, a third current mirror, a fourth current mirror, and a current reversal circuit for replicating current produced in the output conductor of the switchable constant current source and causing the replicated current to flow both out of a control terminal of the third current mirror and into a control terminal of the fourth current mirror, the third current mirror having an output terminal coupled to the first bias terminal of each input buffer, and the fourth current mirror having an output terminal coupled to the second bias terminal of each input buffer.

9. A circuit for multiplexing a selected one of a plurality of input signals to a selected one of a plurality of output conductors, comprising:
   (a) M multiplexors, arranged as an N by M array of input buffers each having an input terminal coupled to receive an input signal, respectively, corresponding inputs of the M multiplexors being coupled together to receive the same input signal, each input buffer having a low impedance output terminal;
   (b) a plurality of switched bias current circuits coupled to the input buffers, respectively, for supplying the an operating (+) bias current into a first bias terminal of one of the input buffers of at least one of the M multiplexors and sinking an operating (−) bias current from a second bias terminal of the input buffer of the at least one of the M multiplexors to select one of the input buffers of at least one of the M multiplexors in response to the at least one selection control signal and preventing flow of the operating (+) bias current and the operating (−) bias current in the input buffers which are not presently selected;

(c) each of the M multiplexors having an output buffer with an output coupled to the output conductor of that multiplexor;

(d) each of the M multiplexors having a feedback resistor coupled between the output conductor of that multiplexor and the low impedance output terminals of the input buffers of that multiplexor; and (e) each of the M multiplexors having a first current mirror having a control input coupled to a third bias terminal of each of the input buffers of that multiplexor, a first output coupled to an input of the output buffer of that multiplexor, and a second output coupled to a first bias terminal of the output buffer of that multiplexor, and a second current mirror having a control input coupled to a fourth bias terminal of each of the input buffers of that multiplexor, a first output coupled to the input of the output buffer of that multiplexor, and a second output coupled to a second bias terminal of the output buffer of that multiplexor.

10. A circuit for multiplexing a selected one of a plurality of input signals to an output conductor, comprising:

(a) a plurality of diamond follower input buffers each having an input terminal coupled to receive an input signal, respectively, each diamond follower input buffer having a low impedance output terminal, and first, second, third and fourth bias terminals;

(b) a first conductor coupled to the third bias terminal of each diamond follower input buffer, and a second conductor coupled to the fourth bias terminal of each diamond follower input buffer;

(c) a diamond follower output buffer having an output coupled to the output conductor, an input, and first and second bias terminals;

(d) a first current mirror having a control input coupled to the first conductor, a first output coupled to the input of the diamond follower output buffer, and a second output coupled to the first bias terminal of the diamond follower output buffer, and a second current mirror having a control input coupled to the second conductor, a first output coupled to the input of the diamond follower output buffer, and a second output coupled to the second bias terminal of the diamond follower output buffer;

(e) a feedback resistor coupled between the output conductor and the low impedance output terminals of the diamond follower input buffers; and (f) a first group of switches for selectively coupling the first bias terminals of the diamond follower input buffers to corresponding operating (+) bias current sources in response to a plurality of enable signals, and a second group of switches for selectively coupling the second bias terminals of the diamond follower input buffers to corresponding operating (−) bias current sources in response to the plurality of enable signals, respectively.

11. A circuit for multiplexing a selected one of a plurality of input signals to an output conductor, comprising:

(a) a plurality of diamond follower input buffers each having an input terminal coupled to receive an input signal, respectively, each diamond follower input buffer having a low impedance output terminal, and first, second, third and fourth bias terminals;

(b) a first conductor coupled to the third bias terminal of each diamond follower input buffer, and a second conductor coupled to the fourth bias terminal of each diamond follower input buffer, a third conductor coupled to a first bias current source, and a fourth conductor coupled to a second bias current source;

(c) a diamond follower output buffer having an output coupled to the output conductor, an input, and first and second bias terminals;

(d) a feedback resistor coupled between the output conductor and the low impedance output terminals of the diamond follower input buffers;

(e) a first current mirror having a control input coupled to the first conductor, a first output coupled to the input of the diamond follower output buffer, and a second output coupled to the first bias terminal of the diamond follower output buffer, and a second current mirror having a control input coupled to the second conductor, a first output coupled to the input of the diamond follower output buffer, and a second output coupled to the second bias terminal of the diamond follower output buffer; and (f) a first group of switches for selectively coupling the first bias terminals of the diamond follower input buffers to the third conductor in response to a plurality of enable signals, respectively, and a second group of switches for selectively coupling the second bias terminals of the diamond follower input buffers to the fourth conductor in response to the plurality of enable signals, respectively.

12. A method of multiplexing a selected one of a plurality of input signals to an output conductor, comprising:

(a) selecting one of a plurality of input buffers having the selected input signal applied to an input terminal of the selected input buffer by switching a first operating bias current to cause it to flow into a first bias terminal of the selected input buffer, and switching a second operating bias current to cause it to flow out of a second bias terminal of the selected input buffer so as to fully bias the selected input buffer;

(b) simultaneously with step (a), causing the remaining input buffers which have not been selected to be substantially less than fully biased;

(c) producing a feedback current between the output conductor and an output of the selected input buffer in accordance with a difference between an output voltage on the output conductor and a voltage produced on the output of the selected input buffer in response to the selected input signal; and (d) if the feedback current flows in a first direction, directing the feedback current into a control terminal of a first current mirror, directing a first mirrored output current of the first current mirror into a compensation capacitor connected to an input of an output buffer, and directing a second mirrored output current of the first current mirror into a first bias terminal of the output buffer, and if the feedback current flows in a second direction, directing the feedback current into a control terminal of a second current mirror, directing a first mirrored output current of the second current mirror out of the compensation capacitor, and directing a second mirrored output current of the second current mirror out of a second bias terminal of the output buffer.

13. A system for multiplexing a selected one of a plurality of input signals to an output conductor, comprising:

(a) means for selecting one of a plurality of input buffers having the selected input signal applied to an input terminal of the selected input buffer by switching a first operating bias current to cause it to flow into a first bias terminal of the selected input buffer, and switching a second operating bias current to cause it to flow out of a second bias terminal of the selected input buffer so as to fully bias the selected input buffer;

(b) means for causing input buffers which have not been selected to be substantially less than fully biased;

(c) means for producing a feedback current between the output conductor and an output of the selected input buffer in accordance with a difference between an output voltage on the output conductor and a voltage produced on the output of the selected input buffer in response to the selected input signal; and (d) means for
  i. directing the feedback current into a control terminal of a first current mirror,
  ii. directing a first mirrored output current of the first current mirror into a compensation capacitor connected to an input of an output buffer, and
  iii. directing a second mirrored output current of the first current mirror into a first bias terminal of the output buffer, if the feedback current flows in a first direction; and (e) means for
  i. directing the feedback current into a control terminal of a second current mirror,
  ii. directing a first mirrored output current of the second current mirror out of the compensation capacitor, and
  iii. directing a second mirrored output current of the second current mirror out of a second bias terminal of the output buffer, if the feedback current flows in a second direction.

* * * * *